United States Patent [19]

Danish et al.

[11] Patent Number: 4,555,693

[45] Date of Patent: Nov. 26, 1985

[54] MULTIKEY KEYBOARD FOR INPUTTING DATA INTO A COMPUTER

[75] Inventors: Sherif Danish, Foster City; Adel Danish, Menlo Park, both of Calif.

[73] Assignee: Polytel Corp., Sunnyvale, Calif.

[21] Appl. No.: 453,592

[22] Filed: Dec. 27, 1982

[30] Foreign Application Priority Data

Oct. 27, 1982 [FR] France ................................ 82 17975

[51] Int. Cl.$^4$ ............................................... G06F 3/02
[52] U.S. Cl. .............................. 340/365 S; 178/17 C; 340/365 R; 340/825.79
[58] Field of Search ........... 340/365 R, 365 S, 825.79; 178/18, 17 C; 200/5 A

[56] References Cited

U.S. PATENT DOCUMENTS

| | | | |
|---|---|---|---|
| 3,304,612 | 2/1967 | Proctor | 178/18 |
| 3,798,370 | 3/1974 | Hurst | 178/18 |
| 3,921,165 | 11/1975 | Dym | 178/18 |
| 4,015,254 | 3/1977 | Strandt | 340/365 S |
| 4,164,622 | 8/1979 | Pobgee | 178/18 |
| 4,241,333 | 12/1980 | Giebler | 340/365 S |
| 4,319,078 | 3/1982 | Yokoo | 340/365 A |
| 4,336,529 | 6/1982 | Buan | 340/365 R |
| 4,429,301 | 1/1984 | Crumley | 340/825.79 |
| 4,435,616 | 3/1984 | Kley | 178/18 |
| 4,440,990 | 4/1984 | Nozaki | 200/5 A |

FOREIGN PATENT DOCUMENTS 1412298  11/1955  United Kingdom ............ 340/365 S Primary Examiner—James J. Groody
Attorney, Agent, or Firm—Head, Johnson & Stevenson

[57] ABSTRACT

A multikey keyboard for inputting data into a computer, whose keys place in circuit the points of intersection of an X rank conductor and Y rank conductor matrix, characterized in that X rank and Y rank conductors are respectively connected together by interconnection resistors (R) and to an X output and Y output of the keyboard, intended to be connected to two analog inputs of the computer, so that the resistance values applied at the input of these two latter are representatively X rank and of the Y rank of any key pressed.

19 Claims, 4 Drawing Figures

MULTIKEY KEYBOARD FOR INPUTTING DATA INTO A COMPUTER

Multikey keyboards for inputting data into a computer are generally formed from a matrix of X and Y conductors, whose keys serve for bringing into circuit the corresponding intersection points, and in which the X and Y rank conductors are connected to at least one decoder producing at its output a binary code on seven or eight conductors representative of the position of any key pressed, this code being intended to be applied to a corresponding digital reading input of the computer.

The present invention provides a keyboard of simple construction, doing away with the decoders and numerous connections which they comprise, designed for cooperating more especially with the analog input of the computer and lending itself further advantageously to any application with a large number of keys without changing the number of its coupling connections.

In particular, to this end, the multikey keyboard of the invention for inputting data into a computer, whose keys bring into circuit the points of intersection of a matrix with X rank conductors and Y rank conductors, is essentially characterized in that the conductors of rank X on the one hand and Y on the other are respectively connected together through interconnection resistors and with an X output and Y output of the keyboard intended for connection to two analog inputs of the computer, so that the resistance values applied at the input of these latter are representative of the X and Y rank of any key pressed. Moreover, with such a keyboard may be associated a panel containing information positioned opposite the keys for effecting corresponding data inputs by pressing the chosen keys.

With such a circuit there may also be associated a manual switch circuit for connection to a logic input of the computer so as to introduce at least two distant data or functions per key and by way of each logic input concerned.

Such a keyboard may further be of very simple construction as will be seen from the following embodiments described by way of non-limiting examples and with reference to the drawings in which:

DESCRIPTION OF THE PREFERRED EMBODIMENTS

Figure 1:
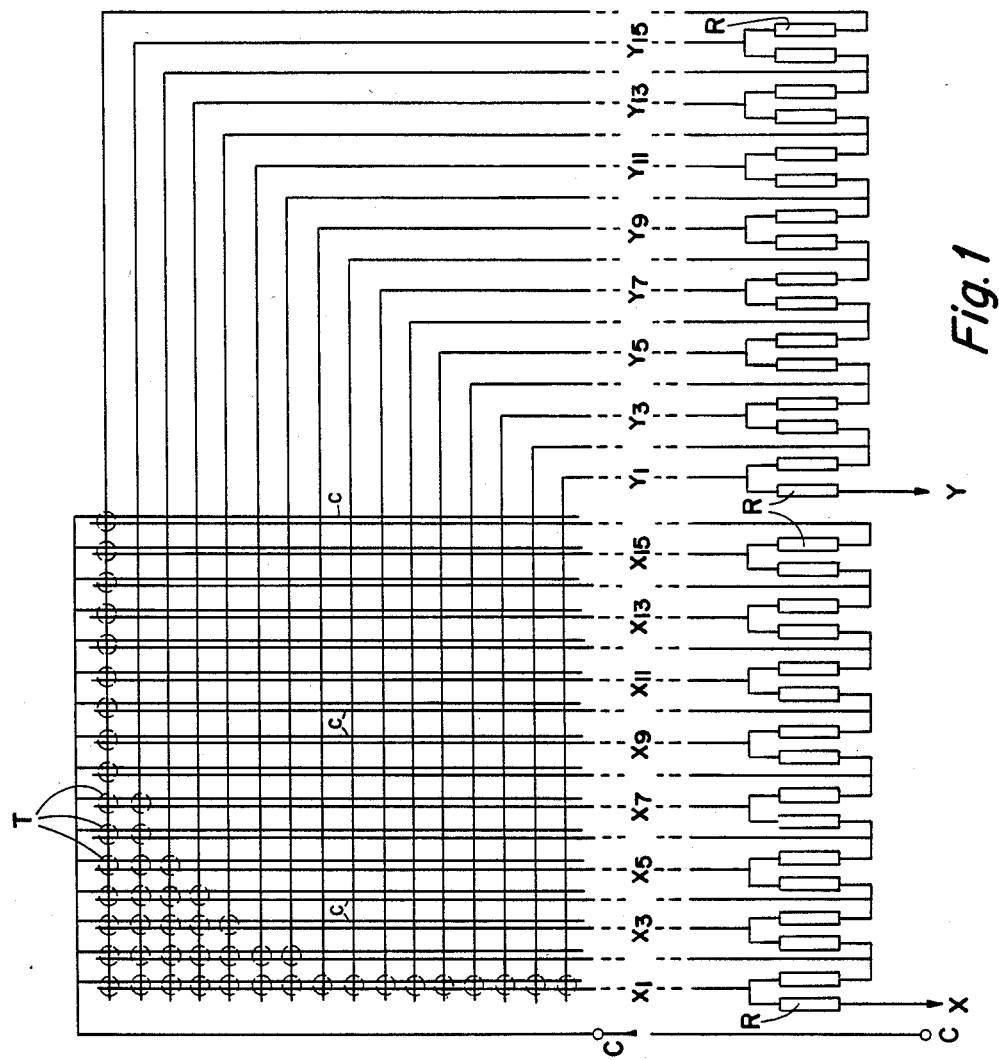
FIG. 1 is a simplified diagram of a first embodiment of the keyboard in accordance with the invention.

In the keyboard embodiment illustrated in FIG. 1, there is provided a matrix of sixteen X conductors (only the conductors of uneven rank designated X1 to X15 being shown for the sake of clarity) and sixteen Y conductors (of which only the conductors of uneven rank designated Y1 to Y15 have been shown). The X rank conductors are connected together at one of their ends as well as to a corresponding endmost output designated by X, by means of series resistors are of equal value. The same goes for the Y rank conductors, whose output is designated by Y. These outputs are intended to be connected respectively to two analog inputs of a computer. A half-matrix of the above-mentioned conductors, here the X half, comprises further, in parallel to these conductors, a network of conductors c, interconnected together and forming a common assembly ending at point C for connection to a supply output of the computer.

At each intersection of the X, Y conductors and the common assembly, there is provided a key T whose role is to establish, when it is pressed, an electric contact of intersection between the common assembly and each corresponding X and Y conductor.

It will be readily understood that each key pressed will be identified in its X rank by the value of resistors R connected thereby between C and the output X, and similarly by the value of resistors R connected thereby between C and the output Y. It has been discovered that the analog inputs of the micro-computers commercially available at present may measure with certainty 64 different resistance intervals, which offers the possibility of constructing therefor a keyboard which could then comprise 4096 keys ($64 \times 64$) by using a matrix with 66X and 64Y conductors and 128 resistors. The example given of a matrix with sixteen X conductors and Y conductors already leads to a keyboard having 256 keys, by using only 36 resistors and only requiring sixteen measuring intervals at each analog input of the computer for identifying the rank of each key, which is much less than the possible sensitivity of this data acquisition input, so that the keyboard may be considered as very reliable. It will be noted that, in the two examples given above, the number of coupling connections will remain the same, that is to say that it is independent of the number of keys desired.

Figure 2:
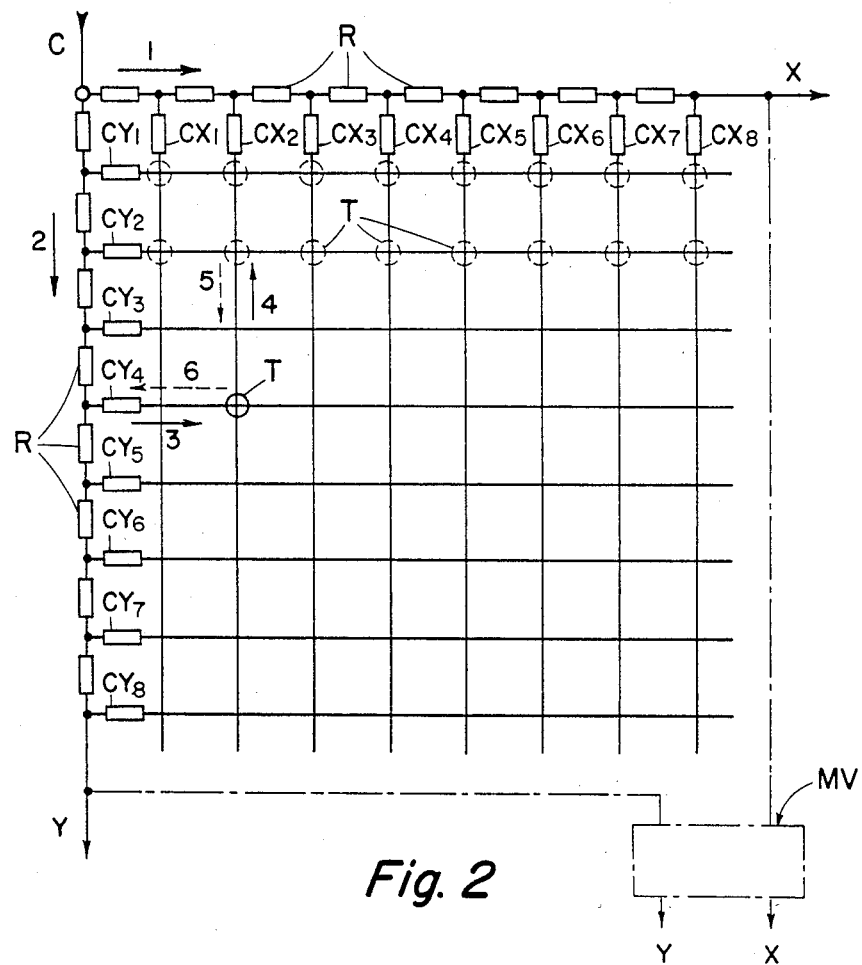
FIG. 2 is a simplified diagram of a second embodiment of the keyboard in accordance with the invention.

The embodiment shown in FIG. 2 is inspired by the same principle for a matrix having only X and Y conductors (here shown as eight X and eight Y conductors for the sake of simplicity of the drawing) in which any intersection is intended to be placed in electrical contact through each corresponding key T, when it is pressed. A common supply point C is connected to the input end of a series of resistors R, having the same value, interconnecting the adjacent ends of the X conductors, the output end being designated by X. The same goes for the Y conductors where the output is designated by Y. Furthermore, each of the X and Y conductors comprises at its end adjacent the connection with resistors R, a resistor which measurement compensation function intended here to conserve always the same resistance value for each X key and each Y key. These resistors are designated CX1 to CX8 and CY1 to CY8 and a decrease in value in the order from 1 to 8 with respect to the value of each resistor R.

Thus, if a key T is pressed such as the one shown with a continuous line in FIG. 2, when X serial scanning is called for by the corresponding analog input of the computer, a current flows from C to Y following initially the two parallel paths designated on the one hand, by arrow 2 and, on the other hand, by arrows 1, 5 and 6, before passing through the four remaining series resistors R as far as the output Y. For any Y key, the resistors such as CX1 to CX8 then compensate the resistance value of this X branch, so that the Y value remains constant.

Considering the interference of the X and Y measuring circuits, if it so happens that the computer is of the type with simultaneous serial scanning of the analog inputs to which the X and Y outputs of the keyboard are connected, alternation of the X and Y outputs should then be introduced before connection to the computer, which may be simply achieved, as shown with a dash dot line in FIG. 2, by connecting the two outputs of the matrix to the inputs of an astable multivibrator MV of appropriate period, whose outputs will thus be activated alternately for alternate X and Y serial scanning.

Figure 3:
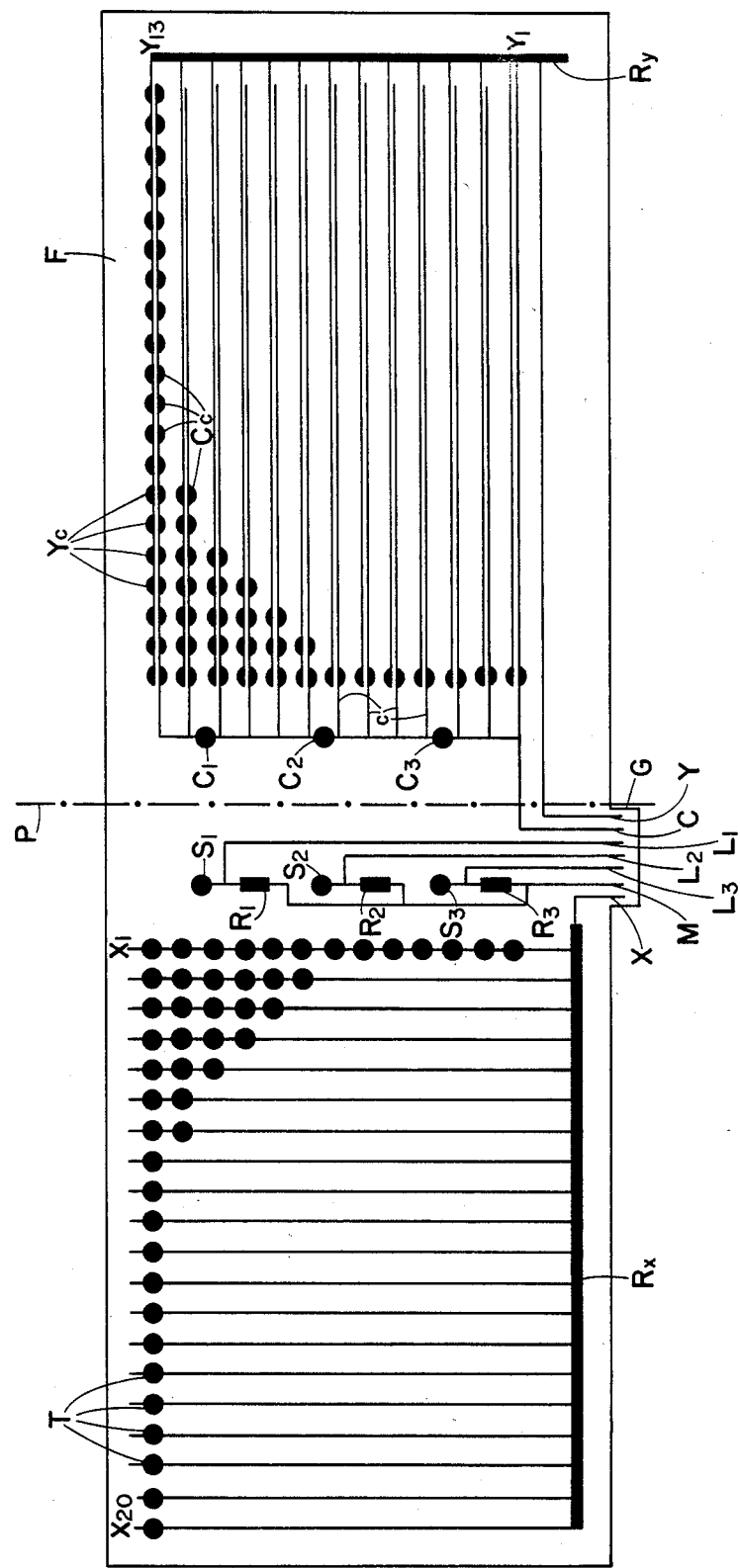
FIG. 3 is a top view of the diagram of a printed circuit for forming a keyboard in accordance with the first above-mentioned embodiment.
Figure 4:
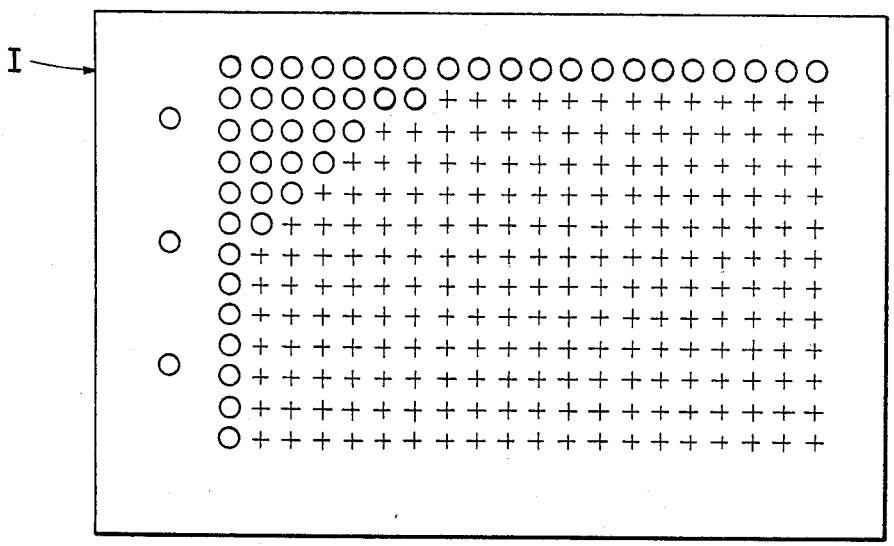
FIG. 4 is a top view of an inset sheet intended to be placed between the printed circuits of FIG. 3 on a support able to be folded on itself.

In an embodiment according to the simplified diagram of FIG. 1 and illustrated by FIGS. 3 and 4, the X half-matrix (conductors X1 to X20) and the Y half-matrix (conductors Y1 to Y30) with the common assembly of conductor c, are printed on the two halfs of a sheet F foldable about the axis indicated at P, so that the two keys T printed on the X half-matrix, are then positioned after folding opposite a corresponding series of semi-circular contact zones Yc and Cc, respectively formed on the Y half-matrix and the conducting network of the common assembly. The X half-matrix is further bordered at one of the ends of these conductors by a resistive track RX, and likewise the Y half-matrix is bordered by a resistive track at RY, said tracks being being connected respectively at their free projecting end to X and Y output conductors, the supply input of the common assembly being designated by C.

In the present case, it is further provided to associate with the keys of the keyboard manual key switches, each intended to be connected to a logic input of the computer so as to introduce as many distinct data or functions per key T of the keyboard and through the logic path concerned.

These switches, here three in number, are respectively formed by circular contact zones C1, C2, C3 provided on the general conductor of the common assembly and by keys S1, S2, S3, arranged symmetrically with respect to the fold line P and all connected, by a resistive track section, respectively R1, R2, R3, to a common conductor M intended to be connected to the polarity opposite that of the common assembly (for example to ground when the common assembly is at a positive polarity). Between keys S1, S2, S3 and the resistive tracks are R1, R2, R3 are connected shunt output conductors L1, L2, L3 whose high or low logic state thus depends on the pressed or unpressed state of the corresponding key.

FIG. 4 illustrates the construction of an insulating inset sheet I intended to be immobilized between the two half sheets folded one towards the other of sheet F (for example by bonding) and having a series of perforations corresponding to keys and S1, S2 and S3, so that these latter may then be pressed by deformation of sheet F through said perforations so as to establish the activation contacts of outputs X, Y and possibly L1, L2, L3. These latter and the connection conductors C and M are grouped together on a tab G disposed on one side of the fold line P so as to form a flat tab for connection with a female socket not shown of connection conductors corresponding to the inputs of the computer.

In particular, sheet F may be transparent and keys T may be printed directly or on the back, with their identification sign. Their sign may also be added to the back of the sheet by bonding.

Moreover, depending on the applications, with such a keyboard there may be associated a panel indicating the specific options of this application and comprising a key design adapted to the application which is superimposed on that of the keyboard. Such applications may be among others:

Data input inscribed at specific positions on a document conceived as forming the panel to be superimposed on the keys of the keyboard for this purpose.

Selection of objects or equivalents appearing on a panel superimposable on the keys, or data processing concerning them.

Geographical or topographical relation data with a display screen, established through a panel superimposable on the keyboard (supervision of premises or teaching system for example).

This list is not exhaustive, but it is emphasized that a piece of equipment (the panel) may thus be associated with the corresponding software of the computer for each application, this panel being perhaps more difficult to reproduce if for example, it is made with pale colors and to a keyboard dimension exceeding the conventional format of photocopiers.

Of course, different variations on applications may be imagined while remaining within the scope of the present invention.

We claim:

1. A multikey keyboard for inputting data into the computer, whose keys place in circuit the point of intersection of a matrix of X rank and Y rank conductors, characterized in that the X rank conductors, on the one hand, and the Y rank conductors, on the other, are respectively connected together by interconnection resistors (R) and to an output X and an output Y of the keyboard, intended to be connected to two analog inputs of the computer, so that the resistance values applied at the input to these latter are representative of the X rank and of Y rank of any key pressed in that the resistance for any key of a given X or Y rank is substantially constant for all keys of the same column or row, respectively, but differ in resistance from column to column or row to row.

2. The multikey keyboard according to claim 1 characterized in that there is associated therewith a panel containing information positioned opposite the keys so as to effect the corresponding data inputs by pressing the chosen keys.

3. The multikey keyboard according to claim 1 or 2, characterized in that it comprises at least one manual switch circuit (S1, S2, S3) intended to be connected to a logic input of the computer so as to introduce at least two distinct data or functions per key and through the path of each logic input concerned.

4. The multikey keyboard according to claim 3, wherein each maual switch is formed by a key for closing the corresponding circuit.

5. A multikey keyboard of claim 1 wherein said resistance values applied at the analog of the computer representative of the X rank and of the Y rank of any key pressed comprises a common assembly intended to be connected to the common line at the analog inputs of the computer wherein said common assembly is selected from the group consisting of:
   (a) a network of conductors in parallel to at least one of said X rank or Y rank conductors wherein said network of conductors is intended to be connected to the common line; and
   (b) a set of compensation resistors wherein one compensation resistor is present in each of said X rank and Y rank conductors adjacent to the connection with said interconnection resistors (R) and wherein the other ends of said interconnection resistors (R)

opposite the connection of the output X and the output Y of the keyboard are intended to be connected to the common line and wherein the resistive value of said compensation resistor is selected to conserve the same resistance value between the ends of said interconnection resistors (R) connecting to the common line and each X key of a given column and each Y key of a given row.

6. A multikey keyboard for inputting data directly into the analog input of a computer comprising two oppositely facing printed circuit sheets separated by an insulating sheet perforated at the position of the keys, wherein at least one of the printed circuit sheets is flexible and which may be pressed at the position of said keys, and wherein one of said printed circuit sheets further comprises the X conductor half-matrix and the other of said printed circuit sheets comprises the Y conductor half-matrix, and wherein the conductors of the respective half-matrices are connected together by interconnection resistors (R) and to an output X or an output Y of the keyboard, intended to be connected to two analog inputs of the computer, so that the resistance values applied at the inputs of the computer are representative of the X rank and of the Y rank of any key pressed in that the resistance of any key for a given X or Y rank is substantially constant for all keys of the same column or row, respectively, but differ in resistance from column to column and row to row and wherein one of said conductor half-matrices being further provided with a conductor network in parallel to its conductors thus forming a common assembly.

7. The multikey keyboard according to claim 6, characterized in that the above-mentioned resistors are deposited in the form of layers on each facing sheet of the printed circuit.

8. The multikey keyboard according to claim 6 further comprising at least one manual switch circuit (S1, S2, S3) and key intended to be connected to a logic input of the computer so as to introduce at least two distinct data or functions per key and wherein said manual switch circuit and corresponding key are respectively formed on said two printed circuit sheets.

9. The multikey keyboard according to claim 6, characterized in that the two printed circuit sheets result from folding a single printed sheet on itself, one of said sheets having a projecting tab carrying the input and output conductors on the keyboard.

10. The multikey keyboard according to claim 7, characterized in that the two printed sheets result from folding a single printed sheet on itself, one of said sheets having a projecting tab carrying the input and output conductors on the keyboard.

11. The multikey keyboard according to claim 8, characterized in that the two printed sheets result from folding a single printed sheet on itself, one of said sheets having a projecting tab carrying the input and output conductors on the keyboard.

12. A multikey keyboard for inputting data directly into the analog input of a computer comprising two oppositely facing printed circuit sheets separated by an insulating sheet perforated at the position of the keys, wherein at least one of the printed circuit sheets is flexible and which may be pressed at the position of said keys, and wherein one of said printed circuit sheets further comprises the X conductor half-matrix and the other of said printed circuit sheets comprises the Y conductor half-matrix and wherein the conductors of the respective half matrices are connected together by interconnection resistors (R) and to an output X or an output Y of the keyboard and wherein a compensation resistor is present in each of said X rank and Y rank conductors adjacent to the connection with said interconnection resistors (R) and wherein the other ends of said interconnection resistors (R) opposite the connection of the output X and the output Y of the keyboard are connection to the common output of the keyboard and wherein the resistance value of said compensation resistor is selected to conserve the same resistance value between the common output of the keyboard and the output X and output Y of the keyboard for each X key of a given column and each Y key of a given row.

13. The multikey keyboard according to claim 12, characterized in that the above-mentioned resistors are deposited in the form of layers on each facing sheet of the printed circuit.

14. The multikey keyboard according to claim 12 further comprising at least one manual switch circuit (S1, S2, S3) and key intended to be connected to a logic input of the computer so as to introduce at least two distinct data or functions per key and wherein said manual switch circuit and corresponding key are respectively formed on said two printed circuit sheets.

15. The multikey keyboard according to claim 12, characterized in that the two printed circuit sheets result from folding a single printed sheet on itself, one of said sheets having a projecting tab carrying the input and output conductors on the keyboard.

16. The multikey keyboard according to claim 13, characterized in that the two printed sheets result from folding a single printed sheet on itself, one of said sheets having a projecting tab carrying the input and output conductors on the keyboard.

17. The multikey keyboard according to claim 14, characterized in that the two printed sheets result from folding a single printed sheet on itself, one of said sheets having a projecting tab carrying the input and output conductors on the keyboard.

18. A method of inputting data to and executing commands of a computer comprising the steps of:
(a) providing a computer and software comprising a visual display output, a keyboard input and an analog input connection;
(b) connecting a multikey keyboard to the analog input connection of said computer wherein the keys of said multikey keyboard place in circuit the point of intersection of a matrix of X rank and Y rank conductors, characterized in that the X rank conductors, on one hand, and the Y rank conductors, on the other hand, are respectively connected together by interconnection resistors (R) and to an output X and output Y of the keyboard which in turn is connected to the corresponding analog inputs of the computer, so that the resistance values applied at the analog inputs to the computer are representative of the X rank and Y rank of any key pressed in that the resistance for any key of a given X or Y rank is substantially constant for all keys of the same column or row, respectively, but differ in resistance from column to column or row to row.

19. A method of claim 18 wherein said resistance values applied at the analog inputs of the computer representative of the X rank and of the Y rank of any key pressed comprises a common assembly intended to be connected to the common line at the analog inputs of the computer wherein said common assembly is selected from the group consisting of:

(a) a network of conductors in parallel to at least one of said X rank or Y rank conductors wherein said network of conductors is intended to be connected to the common line; and
(b) a set of compensation resistors wherein one compensation resistor is present in each of said X rank and Y rank conductors adjacent to the connection with said interconnection resistors (R) and wherein the other ends of said interconnection resistors (R) opposite the connection of the output X and the output Y of the keyboard are intended to be connected to the common line and wherein the resistive value of said compensation resistor is selected to conserve the same resistance value between the ends of said interconnection resistors (R) connecting to the common line and each X key of a given column and each Y key of a given row.

* * * * *